US 8,065,355 B2

(12) United States Patent
Bang et al.

(10) Patent No.: US 8,065,355 B2
(45) Date of Patent: Nov. 22, 2011

(54) INTERPOLATION FIR FILTER HAVING MULTIPLE DATA RATES IN MOBILE COMMUNICATION SYSTEM AND METHOD OF FILTERING DATA USING THE SAME

(75) Inventors: Young-Jo Bang, Daejeon (KR); Youn-Ok Park, Daejeon (KR)

(73) Assignees: Samsung Electronics Co., Ltd., Suwon-si (KR); Electronics and Telecommunications Research Institute, Daejeon (KR)

(*) Notice: Subject to any disclaimer, the term of this patent is extended or adjusted under 35 U.S.C. 154(b) by 1061 days.

(21) Appl. No.: 11/925,712

(22) Filed: Oct. 26, 2007

(65) Prior Publication Data

US 2008/0133630 A1    Jun. 5, 2008

(30) Foreign Application Priority Data

Dec. 1, 2006 (KR) .................. 10-2006-0120760
Feb. 26, 2007 (KR) .................. 10-2007-0018971

(51) Int. Cl.
*G06F 17/17* (2006.01)

(52) U.S. Cl. .................. 708/313; 708/316

(58) Field of Classification Search .......... 708/300–323
See application file for complete search history.

(56) References Cited

U.S. PATENT DOCUMENTS

| | | | | |
|---|---|---|---|---|
| 5,325,318 A * | 6/1994 | Harris et al. | .................. | 708/313 |
| 5,621,675 A * | 4/1997 | Linz et al. | ...................... | 708/313 |
| 5,892,694 A * | 4/1999 | Ott | .................. | 708/313 |
| 5,928,314 A * | 7/1999 | Pelgrom et al. | ............... | 708/319 |
| 5,978,420 A * | 11/1999 | Koslov et al. | .................. | 708/313 |
| 6,052,701 A * | 4/2000 | Koslov et al. | .................. | 708/313 |
| 6,137,349 A * | 10/2000 | Menkhoff et al. | ............ | 708/313 |
| 6,337,999 B1 * | 1/2002 | Orban | .......................... | 708/313 |
| 6,351,451 B1 * | 2/2002 | Butash | .......................... | 708/319 |
| 6,834,292 B2 * | 12/2004 | Jiang et al. | ..................... | 708/313 |
| 7,196,642 B2 * | 3/2007 | van Baarsen et al. | ......... | 708/313 |
| 7,492,848 B2 * | 2/2009 | Gurrapu | ....................... | 708/319 |
| 2004/0120393 A1 | 6/2004 | Lin | | |

FOREIGN PATENT DOCUMENTS

KR    1020040027371 A    4/2004

* cited by examiner

*Primary Examiner* — Tan V Mai
(74) *Attorney, Agent, or Firm* — Jefferson IP Law, LLP (57) ABSTRACT

The present invention relates to an interpolation FIR (finite impulse response) filter having multiple data rates in a mobile communication system, and a method of filtering data using the same. In the method of filtering data using the interpolation FIR filter, a first filter uses an FIR low pass filter that restricts a band to satisfy a bandwidth corresponding to a data spectrum mask required in the mobile communication system. The other filters use interpolation FIR halfband filters that are implemented by a small number of taps. Accordingly, the interpolation FIR filter having multiple data rates can be easily implemented, and can be easily applied to the mobile communication system that transmits and receives data having various data rates.

15 Claims, 5 Drawing Sheets

INTERPOLATION FIR FILTER HAVING MULTIPLE DATA RATES IN MOBILE COMMUNICATION SYSTEM AND METHOD OF FILTERING DATA USING THE SAME

CROSS-REFERENCE TO RELATED APPLICATION

This application claims priority to and the benefit of Korean Patent Application No. 10-2006-0120760 filed in the Korean Intellectual Property Office on Dec. 1, 2006, and No. 10-2007-0018971 filed in the Korean Intellectual Property Office on Feb. 26, 2007, the entire contents of which are incorporated herein by reference.

BACKGROUND OF THE INVENTION (a) Field of the Invention

The present invention relates to a mobile communication system, and more particularly, to an interpolation FIR filter and a method of filtering data using the same.

(b) Description of the Related Art

In recent years, among mobile communication systems, various communication systems that are based on an orthogonal frequency division multiplexing (OFDM) scheme have been known. For example, there are the IEEE 802.11a as the wireless LAN (WLAN) standard and the IEEE 802.16e as the portable Internet standard. A variety of communication systems based on the standards are designed to operate in various bandwidths that are defined. For this reason, it has been required to develop a modem that can process various data rates.

However, in the modem that can process multiple data rates, individual filters need to be provided so as to correspond to each data rate, and when the number of data rates required in a system increases, it becomes complicated to implement filters.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an interpolation FIR filter, having advantages of being easily implemented in a mobile communication system and processing multiple data rates.

Further, the present invention provides a method of filtering data using an interpolation FIR filter.

An exemplary embodiment of the present invention provides a method of filtering received data in a mobile communication system. The method includes confirming a data rate of the received data; interpolating the received data according to first interpolation magnification when the data rate is within a predetermined data rate range, filtering the interpolated data using a first clock frequency set according to the data rate, and outputting the filtered data as first data; and interpolating the first data according to second interpolation magnification when the data rate is out of the predetermined data rate range, filtering the interpolated first data using a second clock frequency set according to the data rate, and outputting the filtered data as second data.

Another embodiment of the present invention provides a filter that filters received data in a mobile communication system. The filter includes a clock controller that confirms a data rate of the received data, determines whether the data rate of the received data is within a predetermined data rate range, sets a clock frequency for the received data on the basis of the determined result, and outputs the clock frequency; a first filter unit that interpolates the received data according to first interpolation magnification, filters the interpolated data using a first clock frequency set according to the data rate, and outputs the filtered data as first data; and a second filter unit that interpolates the first data according to second interpolation magnification on the basis of the data rate of the received data, filters the interpolated first data using a second clock frequency set according to the data rate, and outputs the filtered data as second data. The second filter unit is activated by a clock frequency that is output from the clock controller only when the data rate of the received data is out of the predetermined data rate range.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, unless explicitly described to the contrary, the word "comprise" and variations such as "comprises" or "comprising" will be understood to imply the inclusion of stated elements but not the exclusion of any other elements.

Before describing an interpolation finite impulse response (hereinafter simply referred to as "FIR") filter according to an exemplary embodiment of the present invention, the description is first given to a structure of a transmitter, a structure of an interpolation FIR filter for a data rate, and a structure of an interpolation FIR filter for multiple data rates where a plurality of filters exist according to data rates, which are generally used.

Figure 1:
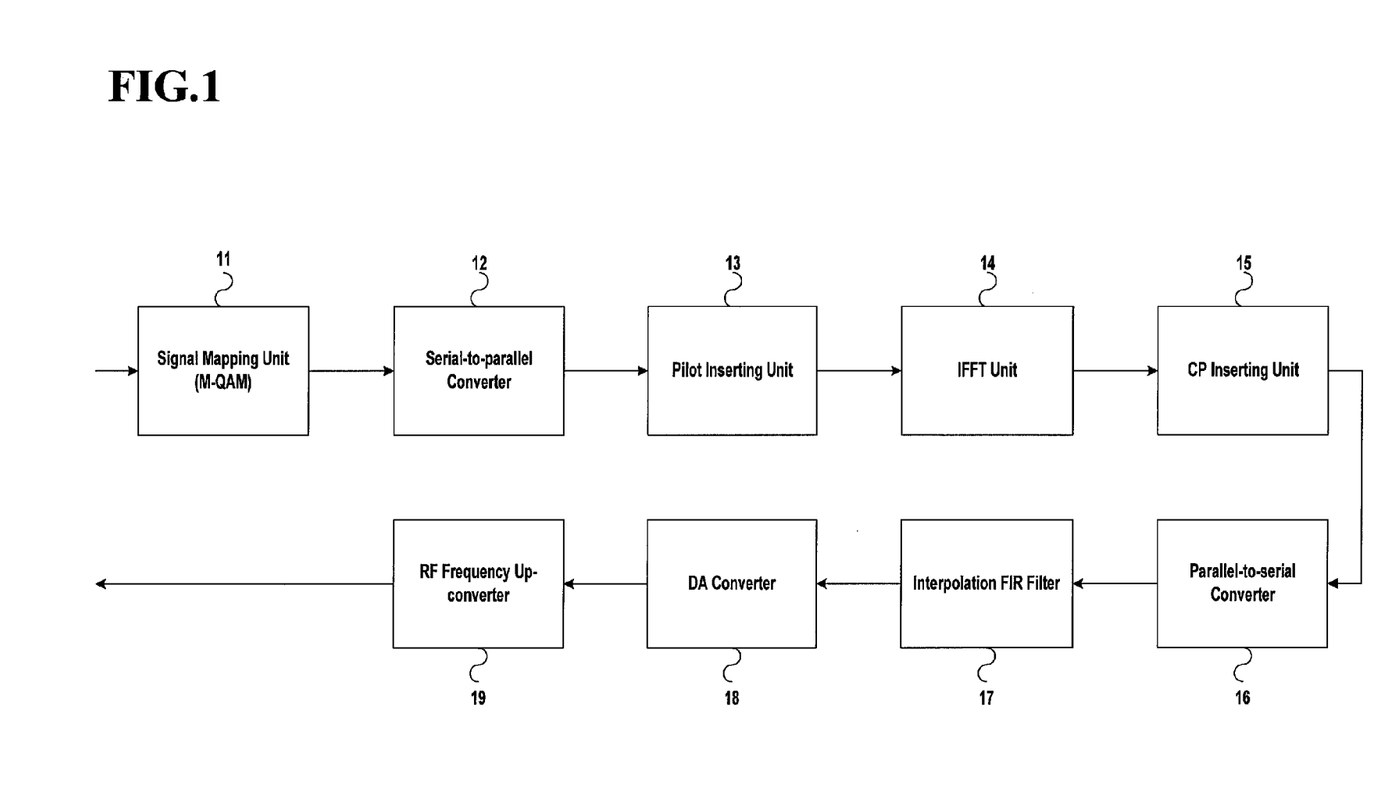
FIG. 1 is a configuration diagram illustrating a transmitter of a general communication system.

FIG. 1 is a configuration diagram illustrating a transmitter of a general communication system.

As shown in FIG. 1, a transmitter of a communication system includes a signal mapping unit 11, a serial-to-parallel converter 12, a pilot inserting unit 13, an inverse fast Fourier transform (IFFT) unit 14, a CP (cyclic prefix) inserting unit 15, a parallel-to-serial converter 16, an interpolation FIR filter 17, a DA (digital to analog) converter 18, and an RF frequency up-converter 19.

The signal mapping unit 11 maps a transmission signal according to a modulation method that is used for binary data that is scheduled to be transmitted to a receiving unit. In general, the signal mapping unit 11 maps the transmission signal using a QAM (quadrature amplitude modulation) method. In this case, the QAM method may be a modulation method such as a QPSK (quaternary phase shift keying) method, a 16-QAM method, or a 64-QAM method.

The transmission signal, which has been mapped by using any one of the above-described modulation methods in the signal mapping unit 11, is converted to parallel by the serial-to-parallel converter 12. Then, a pilot is inserted into the transmission signal by the pilot inserting unit 13. At this time, a pilot is inserted into each OFDM symbol at a predetermined interval so as to allow the receiving unit to estimate a channel. In this case, the interval at which the pilots are inserted is adjusted according to a channel environment where the OFDM mobile communication system is used.

Each OFDM symbol data that includes a pilot is subjected to the inverse fast Fourier transform by the IFFT unit 14. In the parallel-to-serial converter 16, each OFDM symbol data is converted into a signal that is in a serial form so as to be transmitted to the receiving unit. At this time, an interpolation process needs to be performed in order to tune the OFDM symbol data to a sampling frequency that is used in the DA converter 18, before performing an analog conversion on the OFDM symbol data.

The interpolation process is performed by the interpolation FIR filter 17. In order to tune the OFDM symbol data, which is input at a data rate $f_{data}$, to a sampling frequency $f_{samp}$ used in the DA converter 18, it is required to perform an interpolation M times (in this case, $M=f_{data}/f_{samp}$). The data output by the interpolation FIR filter 17 is converted into an analog signal by the DA converter 18. Then, the output data is modulated with a predetermined RF frequency, which is required in a mobile communication system, by the RF frequency up-converter 19, thereby obtaining the output of the modulated transmission signal that is to be transmitted to the receiving unit.

The structure of a general interpolation FIR filter in the mobile communication system having the above-described transmitter, which can process one data rate, will be described with reference to FIG. 2.

Figure 2:
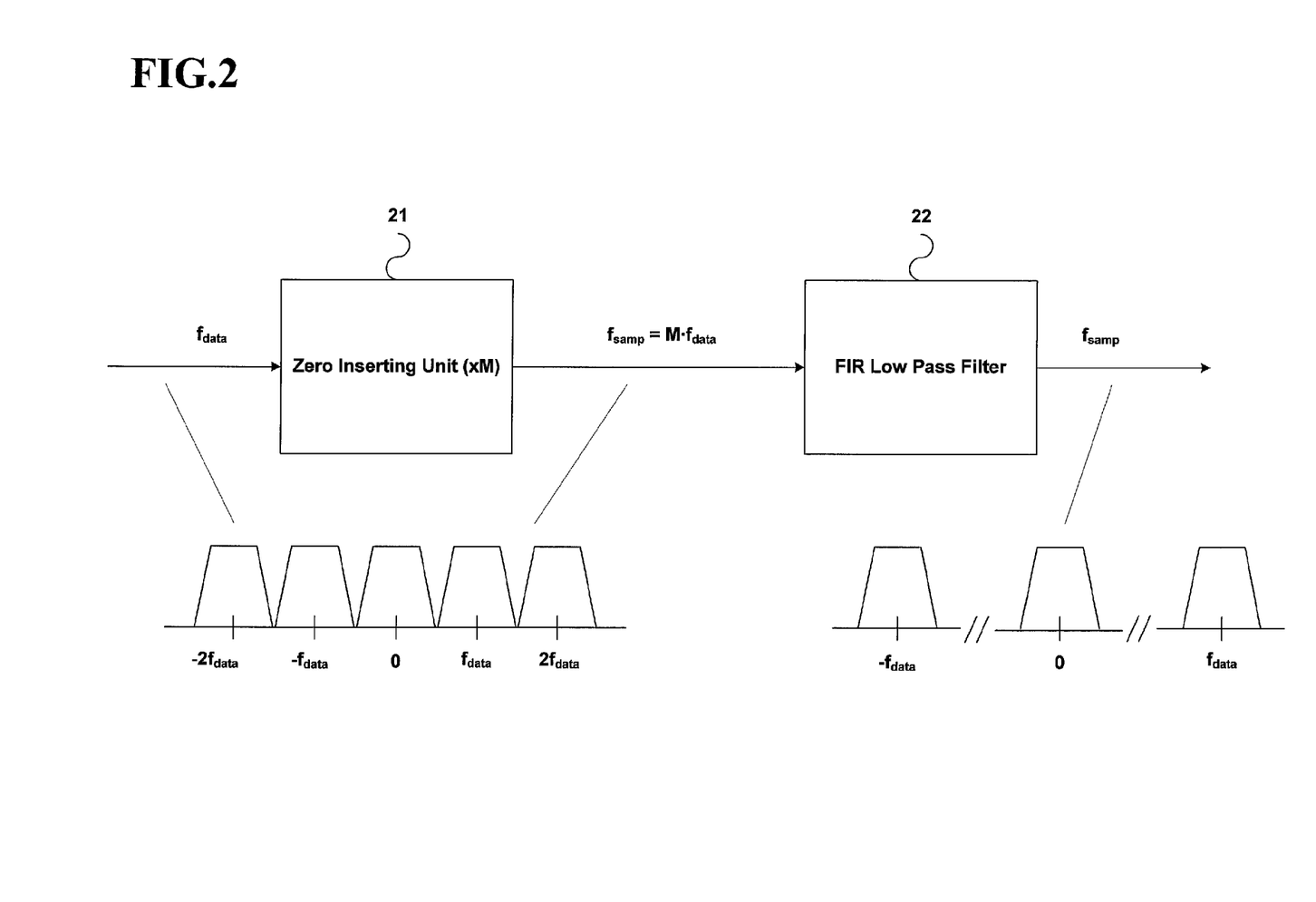
FIG. 2 is a configuration diagram illustrating a general interpolation FIR (finite impulse response) filter that can process one data rate.

FIG. 2 is a configuration diagram illustrating a general interpolation FIR filter for a data rate.

As shown in FIG. 2, the interpolation FIR filter includes a zero inserting unit 21 and an FIR low pass filter 22.

The zero inserting unit 21 inserts an (M−1) zero between the input data to make the input data have a data rate M times as fast ($Mf_{data}=f_{samp}$). The FIR low pass filter 22 is designed according to a bandwidth that is required by the system, and the required bandwidth needs to be smaller than the data rate $f_{data}$. Further, since the sampling frequency of the FIR low pass filter 22 satisfies the condition $f_{samp}=Mf_{data}$, when M increases, the number of required filter coefficients increases. As a result, it becomes difficult to implement the system.

A general interpolation FIR filter that can process multiple data rates will now be described with reference to FIG. 3.

Figure 3:
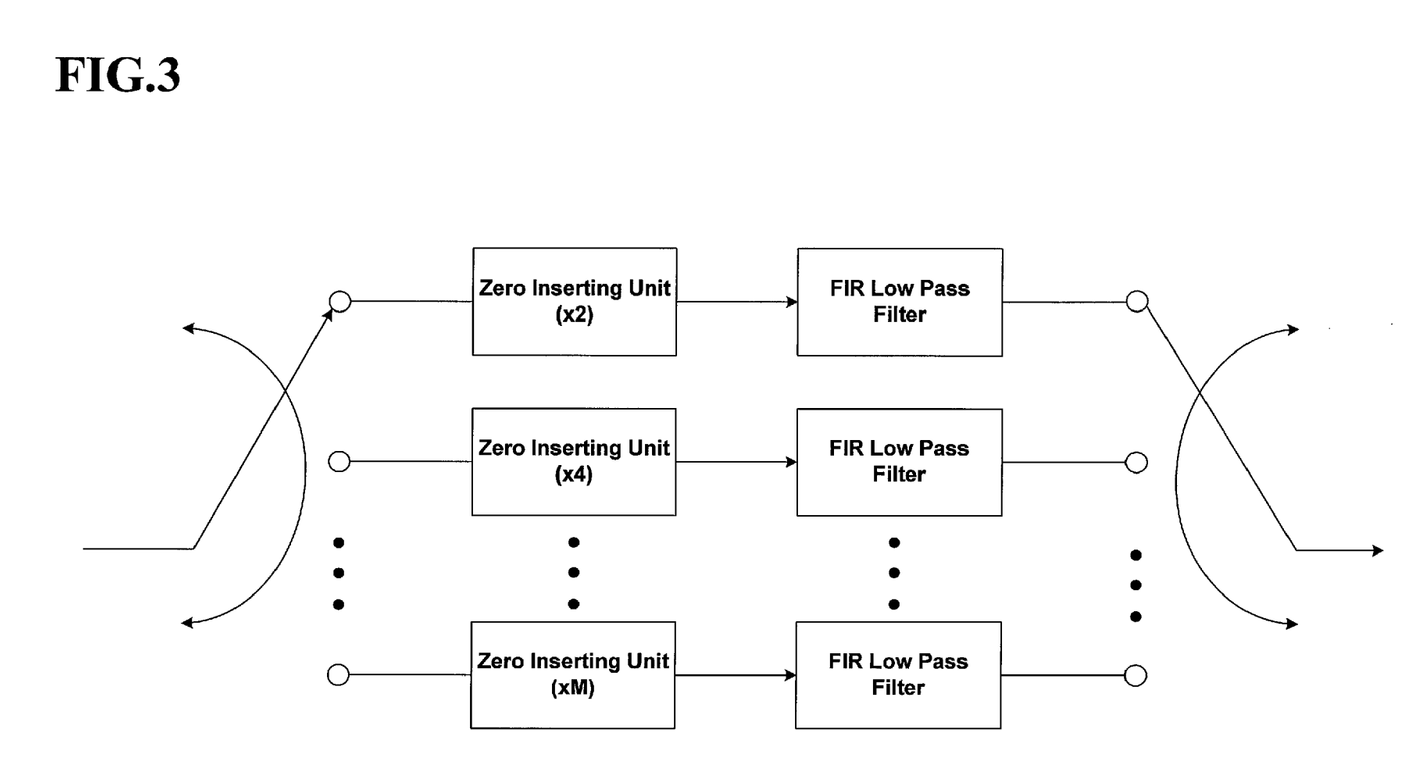
FIG. 3 is a configuration diagram illustrating a general interpolation FIR filter that can process multiple data rates.

FIG. 3 is a configuration diagram illustrating a general interpolation FIR filter that can process multiple data rates.

As shown in FIG. 3, in the general interpolation FIR filter that can process the multiple data rates, zero inserting units and FIR low pass filters are disposed. In this case, the zero inserting units perform an interpolation according to predetermined magnification so as to individually correspond to each data rate. Specifically, if a data rate is twice as fast, the zero inserting unit that performs an interpolation twice and the corresponding FIR low pass filter are disposed. Further, if a data rate is four times as fast, the zero inserting unit that performs an interpolation four times and the corresponding FIR low pass filter are disposed. For better comprehension and ease of description, the zero inserting unit and the FIR low pass filter are collectively referred to as a "filter unit".

The number of filter units may be plural. In this case, the filter unit having the lowest interpolation magnification is first disposed at the uppermost side such that filter units having higher interpolation magnifications are sequentially disposed downward. For example, the filter unit that includes the zero inserting unit having the double magnification by interpolation and the corresponding FIR low pass filter is disposed at the uppermost side. According to the interpolation magnifications of the zero inserting units, the filter units are disposed in parallel below the filter unit that includes the zero inserting unit having the double magnification by interpolation.

The above-described constituent elements will now be exemplified. When the data rate satisfies the condition $f_{data}=f_{samp}/2$, the condition M=2 is satisfied. Therefore, switching is made to the uppermost filter unit (that is, the filter unit including the zero inserting unit having the double magnification by interpolation) and the data is processed. Further, as the data rate gradually decreases by multiples of 2, switching is made downward from the uppermost filter. Further, the number of filter coefficients of the FIR low pass filters gradually increases. Therefore, the structure of the interpolation FIR filter becomes complicated. Since respective filters need to be provided so as to correspond to each data rate, if the number of data rates required in the system increases, it becomes complicated to implement the system.

The exemplary embodiment of the present invention provides an interpolation FIR filter that has multiple data rates, but can be easily implemented. Further, the exemplary embodiment of the present invention provides a method of filtering data using the interpolation FIR filter. The interpolation FIR filter and the method of filtering data using the same will be described in detail with reference to FIGS. 4 and 5.

Figure 4:
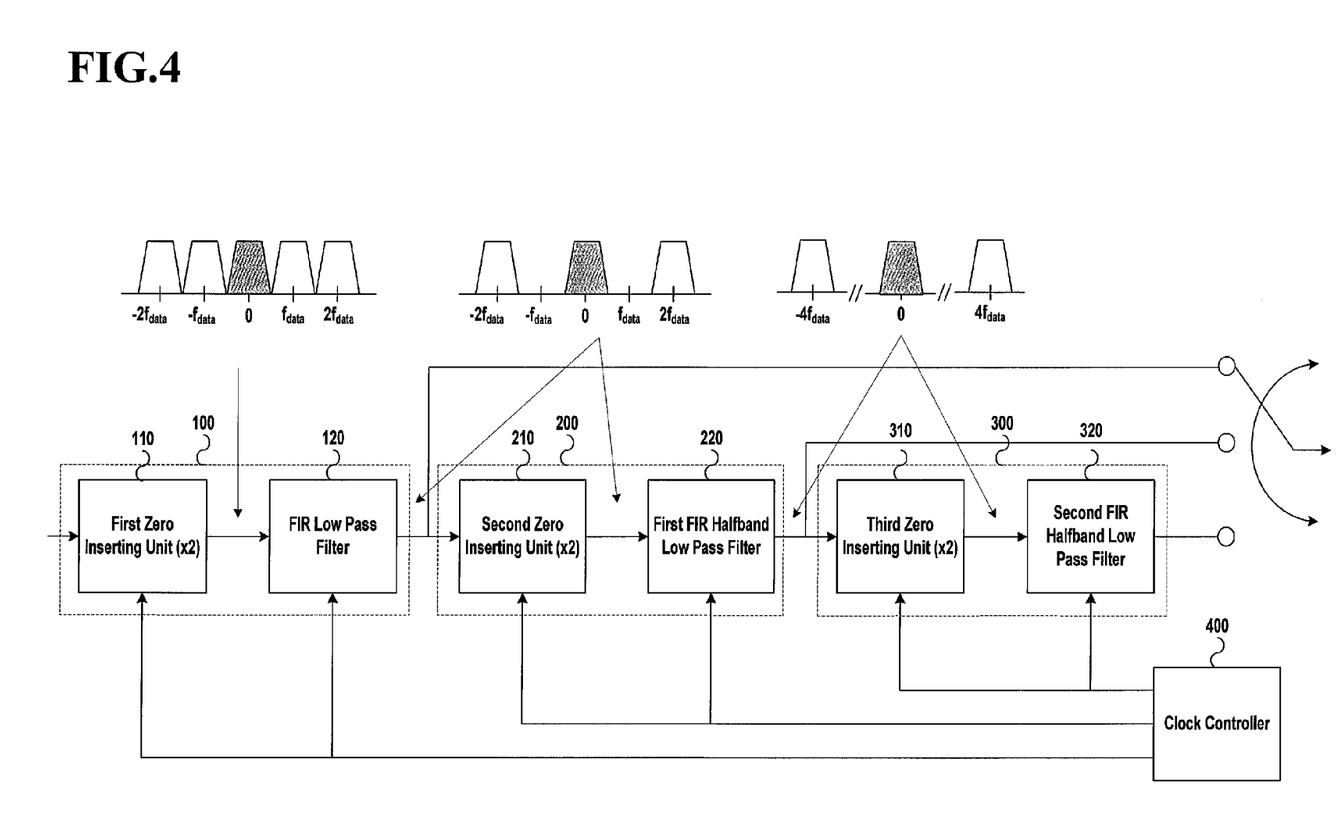
FIG. 4 is a configuration diagram illustrating an interpolation FIR filter according to an exemplary embodiment of the present invention.

FIG. 4 is a configuration diagram illustrating an interpolation FIR filter according to an exemplary embodiment of the present invention.

In the exemplary embodiment of the present invention, the interpolation FIR filter is implemented to include a plurality of filter units. In this case, each filter unit includes a zero inserting unit and an FIR filter, and an output portion of the zero inserting unit is connected to an input portion of the FIR filter.

At this time, the FIR filter of the first filter unit uses an FIR low pass filter, and a plurality of filter units that are connected after the first filter unit use FIR halfband low pass filters to filter input data. As such, if the interpolation FIR filter is implemented by changing the structure of the FIR filters, it is possible to easily implement the interpolation FIR filter having multiple data rates, and the interpolation FIR filter can be easily applied to the mobile communication system.

That is, in order to control the input signal to satisfy a bandwidth that is required in the mobile communication system, the FIR filter of the first filter unit uses an FIR low pass filter of a predetermined multiple. Each of the FIR filters of the FIR filter units, which are located after the first FIR filter unit, uses an FIR halfband low pass filter that is implemented by a small number of taps in the exemplary embodiment of the present invention. At this time, each of the FIR low pass filter and the FIR halfband low pass filter uses an FIR filter that shows a clock frequency that is twice as much as the clock frequency of the general filter. The present invention is not limited thereto.

Further, the interpolation FIR filter according to the exemplary embodiment of the present invention is constructed to process three data rates ($f_{data}=f_{samp}/2$, $f_{samp}/4$, and $f_{samp}/8$). However, in the exemplary embodiment of the present invention, the data rates are not limited to the three data rates. Further, the zero inserting unit that is included in each of the plurality of filter units makes the input data have a data rate that is twice as fast and outputs the data. At this time, the interpolation magnification of the zero inserting unit is not limited to twice the magnification by interpolation.

The filter coefficient of the FIR low pass filter of the first filter unit is set such that data can be processed at a fixed data rate regardless of the data rate of the input data. This is based on the fact that a ratio between the bandwidth required in the mobile communication system and the data rate of the transmitted data is constant in a general OFDM communication system.

As shown in FIG. 4, the interpolation FIR filter that has multiple data rates according to the exemplary embodiment of the present invention includes a first filter unit 100, a second filter unit 200, a third filter unit 300, and a clock controller 400. Each of the first, second, and third filter units 100, 200, and 300 includes a zero inserting unit and an FIR filter. Specifically, each filter unit includes the following constituent elements.

The first filter unit 100 includes a first zero inserting unit 110 and an FIR low pass filter 120. The second filter unit 200 includes a second zero inserting unit 210 and a first FIR halfband low pass filter 220. The third filter unit 300 includes a third zero inserting unit 310 and a second FIR halfband low pass filter 320. In this case, interpolation magnification of each of the first to third zero inserting units 110, 210, and 310 is fixed to double magnification. In the FIR low pass filter 120 and the first and second FIR halfband low pass filters 220 and 320, a clock frequency is set on the basis of the data rate of the input data. This will be described in detail below.

When digital data is converted into analog data to be transmitted, distortion occurs at a frequency in a high-frequency region during the DA conversion process. In order to reduce the distortion from occurring, an interpolation process is performed in which "0" is inserted between symbols. For this purpose, if the data rate of the data that is transmitted from the base station and is then input to the interpolation FIR filter satisfies the condition $f_{data}=f_{samp}/2$, the first zero inserting unit 110 inserts "0" between the symbols of the data and outputs the data to the FIR low pass filter 120. That is, in the exemplary embodiment of the present invention, the first zero inserting unit 110 uses the zero inserting unit having the double magnification by interpolation so as to make the input data have a data rate twice as fast. Therefore, the first zero inserting unit 110 inserts the (M−1) zero, that is, one zero between the input data and outputs the data having the data rate that is twice as fast.

In this case, according to the location of the first zero inserting unit 110, the first zero inserting unit 110 makes the input data have the data rates that are twice as fast, four times as fast, and eight times as fast, respectively, which correspond to the interpolation magnifications, and outputs the data. That is, the first zero inserting unit 110 makes the input data have the data rate two ($=2^1$) times as fast on the basis of the control signal, which is output by the clock controller 400 to be described below, and outputs the data. In this way, the second zero inserting unit 210, which is located in the second filter unit 200, makes the input data have the data rate of four ($=2^2$) times as fast and outputs the data. The third zero inserting unit 310, which is located in the third filter unit 300, makes the input data have the data rate eight ($=2^3$) times as fast and outputs the data. At this time, the interpolation magnification may be set according to the control signal or by a system designer.

The FIR low pass filter 120 receives the data that has the data rate that is twice as fast that is output by the first zero inserting unit 110. Then, the FIR low pass filter 120 leaves only a low frequency component according to a bandwidth required in the system, while converting a high frequency component into a value approximating to 0, such that a waveform of the signal becomes smooth. At this time, the required bandwidth needs to be smaller than the data rate.

In this case, the reason why the FIR low pass filter 120 performs the first filtering when performing filtering on the data that is transmitted from the base station and input to the interpolation FIR filter is because the FIR low pass filter can restrict a band to satisfy a bandwidth that corresponds to a data spectrum mask required in the mobile communication system. Since this is already well-known, the detailed description thereof will be omitted in the exemplary embodiment of the present invention.

The first and second FIR halfband low pass filters 220 and 320 are implemented by the small number of taps as compared with the FIR low pass filter 120. In this case, the tap is a delay element. That is, the number of taps may be regarded as the number of constituent elements in the filter, which one signal needs to pass through until one signal is input to the filter and is then output after being filtered. When the number of taps increases, the amount of time required when filtering one signal is increased, and process capacity to filter one signal is increased.

The reason why the filters disposed after the FIR low pass filter 120 can be used as the FIR halfband low pass filters 220 and 320 is as follows. If only a noise image component according to the frequency of the data is removed in the data that is output after its band is restricted by the FIR low pass filter 120, filtering can be performed. Thus, even though the FIR halfband low pass filters 220 and 320 that are implemented by the small number of taps are used, desired filtering can be performed.

The clock controller 400 outputs a control signal for controlling the respective constituent elements included in the first to third filters 100, 200, and 300, such that the data is output according to the data rate. The clock control unit 400 performs a switching operation such that the data output according to the control signal can be output to the constituent elements connected to the output terminal of the interpolation FIR filter. Further, the clock controller 400 sets an operation clock frequency of the constituent elements that output the data and sets the interpolation magnifications of the first, second, and third zero inserting units 110, 210, and 310. For example, when the data rate satisfies the condition $f_{data}=f_{samp}/2$, the clock controller 400 generates a control signal to output data that has passed through the first zero inserting unit 110 of the first filter unit 100 and the FIR low pass filter 120. The clock controller 400 sets the operation clock frequency of each of the first zero inserting unit 110 and the FIR low pass filter 120 to $f_{samp}$.

As another example, when the data rate satisfies the condition $f_{data}=f_{samp}/4$, the clock controller 400 generates a control signal to output data that has passed through the first zero inserting unit 110 and the FIR low pass filter 120 of the first filter unit 100, and the second zero inserting unit 210 and the first FIR halfband low pass filter 220 of the second filter unit 200. At this time, the clock controller 400 sets the clock frequency of each of the first zero inserting unit 110 and the FIR low pass filter 120 to $f_{samp}/2$, and sets the clock frequency of each of the second zero inserting unit 210 and the first FIR halfband low pass filter 220 to $f_{samp}$.

In this way, if the data rate satisfies the condition $f_{data}=f_{samp}/8$, the clock controller 400 generates a control signal to output data that has passed through all of the constituent elements shown in FIG. 4. At the same time, the clock controller 400 sets the clock frequency of each of the first zero inserting unit 110 and the FIR low pass filter 120 to $f_{samp}/4$, sets the clock frequency of each of the second zero inserting unit 210 and the first FIR halfband low pass filter 220 to $f_{samp}/2$, and sets the clock frequency of each of the third zero inserting unit 310 and the second FIR halfband low pass filter 320 to $f_{samp}$.

A method of filtering data using the interpolation FIR filter that includes the above-described constituent elements will be described with reference to FIG. 5.

Figure 5:
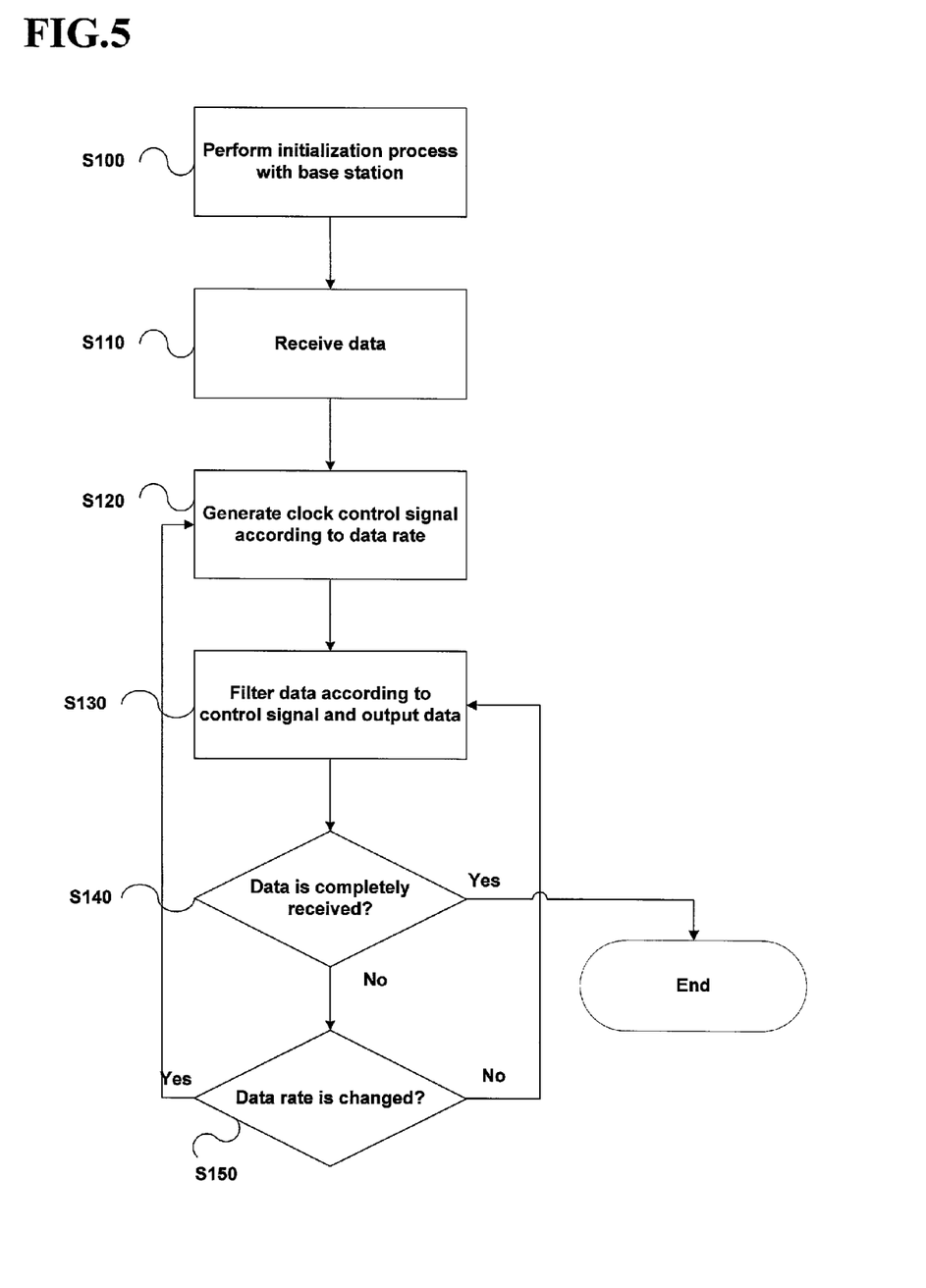
FIG. 5 is a flowchart illustrating a method of filtering data using an interpolation FIR filter that can process multiple data rates according to an exemplary embodiment of the present invention.

FIG. 5 is a flowchart illustrating a method of filtering data using an interpolation FIR filter that has multiple data rates according to an exemplary embodiment of the present invention.

As shown in FIG. 5, a mobile terminal that includes an interpolation FIR filter performs an initialization process with the base station (Step S100). In this case, through the initialization process, the mobile terminal confers with the base station about the data rate of the data that is transmitted from the base station and determines the data rate. In the exemplary embodiment of the present invention, the data rates $f_{data}$ have been described as $f_{data}=f_{samp}/2$, $f_{samp}/4$, or $f_{samp}/8$, but the present invention is not limited thereto. At this time, the number of inserted FIR halfband low pass filters and zero inserting units may be determined on the basis of the determined data rates.

Then, the mobile terminal receives the data from the base station through the generally-known process (Step S110), and filters the received data by using the interpolation FIR filter. Specifically, the clock controller 400 of the interpolation FIR filter generates a clock control signal on the basis of the data rate that has been determined through the initialization process with the base station (Step S120) and performs a switching operation to adjust a location where the data is output. If the data rate $f_{data}$ is determined as $f_{data}=f_{samp}/2$, the clock controller 400 performs a control operation by using a clock control signal, such that the data input to the interpolation FIR filter is output directly after passing through the first filter unit 100. However, if the data rate $f_{data}$ is determined as $f_{data}=f_{samp}/4$, the clock controller 400 performs a control operation using the clock control signal, such that the data input to the interpolation FIR filter is output after passing through the first filter unit 100 and the second filter unit 200.

In this case, the FIR filter of the first filter unit 100 uses the FIR low pass filter 120, and the FIR filters of the second filter unit 200 and the third filter unit 300 use the FIR halfband low pass filters 220 and 320, respectively. The reason thereof will be described below with reference to FIG. 4. A spectrum that is shown at the leftmost side of FIG. 4 shows the output of the first zero inserting unit 110. In this case, the FIR low pass filter 120 passes only a shadow portion of the spectrum.

However, in the general mobile communication system, a mask is used when restricting a band of a transmission signal. Therefore, the characteristic of the filter to which data having passed through the first zero inserting unit 110 is to be input is most important. Thus, in order to restrict the band of the transmission signal, a filter having a large number of taps and a predetermined characteristic is needed. In this case, the most suitable filter is the FIR low pass filter 120.

However, in the spectrum that is shown at an intermediate portion of FIG. 4, signals other than the signal at a shadow portion where a shadow is inserted are allowed to be selected. Therefore, the signals (indicated by $-2f_{data}$ and $2f_{data}$) can be selected by using the first FIR halfband low pass filter 220. That is, since the signal at the shadow portion where a shadow is inserted is separated from the signals other than the signal at the shadow portion, it is possible to implement the interpolation FIR filter such that filtering can be simply performed by the first FIR halfband low pass filter 220 using a small number of taps. In this way, in the spectrum that is shown at the rightmost side of FIG. 4, the distance between the signal at the shadow portion and the signals (indicated by $-4f_{data}$ and $4f_{data}$) other than the signal at the shadow portion is longer than that of the intermediate spectrum. Therefore, it is possible to implement the interpolation FIR filter such that filtering can be simply performed by the second FIR halfband low pass filter 320 using a small number of taps.

As described above, a switching operation is performed according to a clock control and signal that is output by the clock controller 400, and data is filtered and output (Step S130). Then, the mobile terminal determines whether the data is completely received from the base station (Step S140), and when it is determined that the data is completely received, an interpolation process is completed. However, when it is determined that the data is not completely received, it is determined whether a data rate is changed or not (Step S150). At this time, if the data rate is changed, the processes are executed again starting from the process in Step S120 in which the clock controller 400 generates the clock control signal according to the data rate. However, if the data rate is not changed, the first to third filter units 100, 200, and 300 are controlled according to the clock control signal that has been generated by the clock controller 400, and the data is processed.

For the assumption that the data rate $f_{data}$ of the data that is received from the base station is $f_{data}=f_{samp}/8$, the method of filtering data will be described in detail below. The data that has passed through the parallel-to-serial converter 16 shown in FIG. 1 passes through the interpolation FIR filter 17, and is then input to the DA converter 18. At this time, it is assumed that the data rate of the data that is input to the DA converter 18 is constant, that is, "1" in the exemplary embodiment of the present invention, for convenience of description.

Since the data rate of the received data is $f_{samp}/8$, the clock controller 400 generates a control signal such that all of the first to third filter units 100, 200, and 300 operate. At this time, in the first to third filter units 100, 200, and 300, which are controlled by the control signal, the zero inserting units and FIR filters that are the constituent elements in the filters are set.

That is, through the control signal, the first zero inserting unit 110 of the first filter unit 100 outputs the data that is input at the data rate of $f_{samp}/8$ at the data rate that is twice as fast, and the clock frequency of the FIR low pass filter 120 is set to $f_{samp}/4$. The second zero inserting unit 210 of the second filter unit 200 outputs the input data at a data rate that is four times as fast, and the clock frequency of the first FIR halfband low pass filter 220 is set to $f_{samp}/2$. The third zero inserting unit 310 of the third filter unit 300 outputs the input data at the data rate that is eight times as fast, and the clock frequency of the second FIR halfband low pass filter 320 is set to $f_{samp}$.

In the data that has the data rate of $f_{samp}/8$, the data rate of the data increases to $f_{samp}/4$ while the data passes through the first zero inserting unit 110, and the data is filtered at the data rate of $f_{samp}/16$ while the data passes through the FIR low pass filter 120. The data rate of the data that has been filtered at the data rate of $f_{samp}/16$ increases to $f_{samp}/4$ ($4*f_{samp}/16$) while the data passes through the second zero inserting unit 210. The data is filtered as data having the data rate of $f_{samp}/8$ ($f_{samp}/4*f_{samp}/2$) while the data passes through the first FIR halfband low pass filter 220. In this case, the interpolation magnification in each zero inserting unit according to the exemplary embodiment of the present invention is defined as the double magnification, and zeros are inserted with twice the magnification, four times the magnification, and eight times the magnification according to the locations of the zero inserting units.

Finally, in the data that has the data rate of $f_{samp}/8$, the data rate of the data increases to $1(f_{samp}(8*8)$ while the data is input to the third zero inserting unit 310. While the data passes through the second FIR halfband low pass filter 320, the data is filtered as data that is input to the DA converter 18 at the data rate of "1" and is then output.

This is applicable to the case where the data rate is $f_{samp}/2$ or $f_{samp}/4$. At this time, the first to third zero inserting units 110, 210, and 310 perform interpolation at twice the magnification. The FIR low pass filter 120 and the first and second FIR halfband low pass filters 220 and 320 operate by setting the clock frequency through the control signal according to the data rate of the input data.

In this case, a program that is capable of realizing a function corresponding to the structure according to the exemplary embodiment of the present invention and a recording medium having the program recorded therein are within a scope of the present invention.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

According to the above-described exemplary embodiment, in designing the interpolation FIR filter that is used in the mobile communication system having multiple data rates, the plurality of filters that are implemented by changing the structure of the FIR filter are provided to process input data. Therefore, the amount of calculation can be reduced as compared with the case where each FIR low pass filter is provided to correspond to each data rate.

Further, since the controller performs a control operation to allow the parallel filters to filter data according to the data rate of the input data and output it, the present invention can be easily applied to the mobile communication system that has various data rates.

What is claimed is:

1. A method of filtering received data in a mobile communication system, the method comprising:
   identifying a data rate of the received data;
   interpolating the received data according to first interpolation magnification, and filtering the interpolated received data using a first clock frequency set according to the data rate so as to generate first data;
   interpolating the first data according to second interpolation magnification, and filtering the interpolated first data using a second clock frequency that is set according to the data rate so as to generate second data; and
   selectively outputting the first data or the second data based on the data rate,
   wherein a number of taps required when filtering the interpolated first data, which corresponds to a number of steps required for filtering data and indicates an amount of delay, is smaller than a number of taps required when filtering the interpolated received data.

2. The method of claim 1, further comprising:
   interpolating the second data according to a third interpolation magnification, filtering the interpolated second data using a third clock frequency that is set according to the data rate, and outputting the filtered interpolated second data as third data.

3. The method of claim 2, wherein the interpolating of the second data, the filtering of the interpolated second data, and the outputting of the filtered interpolated second data as the third data are repeated according to the data rate of the received data that is out of a predetermined data rate range.

4. The method of claim 3, wherein the second clock frequency that is set to output the second data is twice the first clock frequency that is set to output the first data.

5. The method of claim 4, wherein the first clock frequency that is set to output the first data is used in an FIR (finite impulse response) low pass filter to filter the received data, and the second clock frequency that is set to output the second data is used in an FIR halfband low pass filter to filter the received data and the first data.

6. The method of claim 5, wherein:
   in the outputting of the first data, the received data is filtered such that in a bandwidth of the received data, a component set by the mobile communication system only remains according to a bandwidth used by the mobile communication system; and
   in the outputting of the second data, a noise image component that corresponds to a frequency of the first data is only removed from the first data.

7. The method of claim 1, wherein the selectively outputting of the first data or the second data comprises:
   outputting the first data when the data rate of the received data is within a predetermined data rate range; and
   outputting the second data when the data rate of the received data is not within the predetermined data rate range.

8. A filter that filters received data in a mobile communication system, the filter comprising:
   a clock controller that identifies a data rate of the received data, determines whether the data rate of the received data is within a predetermined data rate range, sets a clock frequency for the received data on the basis of the determined result, and outputs the clock frequency;
   a first filter unit that interpolates the received data according to a first interpolation magnification, and filters the interpolated received data using a first clock frequency that is set according to the data rate so as to generate first data; and
   a second filter unit that interpolates the first data according to a second interpolation magnification on the basis of the data rate of the received data, and filters the interpolated first data using a second clock frequency that is set according to the data rate so as to generate second data,
   wherein the second filter unit is activated by a clock frequency that is output from the clock controller only when the data rate of the received data is out of the predetermined data rate range, and
   wherein the controller generates a signal to selectively output one of the first data and the second data based on the data rate of the received data,
   wherein the first filter unit is a Finite Impulse Response (FIR) low pass filter and the second filter unit is an FIR halfband low pass filter.

9. The filter of claim 8, wherein the first filter unit includes:
- a first zero inserting unit that inserts a zero into the received data at a predetermined location on the basis of the first interpolation magnification and outputs the received data; and
- a first filter that filters the interpolated received data using the first clock frequency such that a bandwidth of the received data where the zero is inserted remains by a predetermined bandwidth, and outputs the filtered interpolated received data as the first data.

10. The filter of claim 9, wherein the second filter unit includes:
- a second zero inserting unit that receives the first data, and inserts a zero into the first data at a predetermined location on the basis of the fixed second interpolation magnification and outputs the first data; and
- a second filter that receives the first data where the zero is inserted and outputs the filtered interpolated first data as the second data after removing a noise image component according to a frequency of the first data using the second clock frequency.

11. The filter of claim 8, further comprising
a third filter unit that includes a third zero inserting unit and a third filter,
wherein the third zero inserting unit interpolates the second data according to third interpolation magnification, and
the third filter filters the interpolated second data using a third clock frequency that is set according to the data rate and outputs the filtered interpolated second data as third data.

12. The filter of claim 11, wherein a plurality of filter units are further provided after the third filter unit, according to the data rate of the received data that is out of the predetermined data rate range.

13. The filter of claim 11, wherein the third filter is an FIR halfband low pass filter.

14. The filter of claim 13, wherein the second interpolation magnification is twice the first interpolation magnification, and the first to third zero inserting units make the data input to the corresponding zero inserting unit have a data rate that is twice as fast and outputs the input data.

15. The filter of claim 8, wherein the controller generates a signal to output the first data when the data rate of the received data is within a predetermined data rate range, and generates a signal to output the second data when the data rate of the received data is not within the predetermined data rate range.

* * * * *